(12) United States Patent
Nazarian

(10) Patent No.: US 7,602,639 B2
(45) Date of Patent: Oct. 13, 2009

(54) READING ELECTRONIC MEMORY UTILIZING RELATIONSHIPS BETWEEN CELL STATE DISTRIBUTIONS

(75) Inventor: Hagop Nazarian, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 108 days.

(21) Appl. No.: 11/957,309

(22) Filed: Dec. 14, 2007

(65) Prior Publication Data

US 2009/0154234 A1 Jun. 18, 2009

(51) Int. Cl.
*G11C 16/04* (2006.01)
*G11C 16/06* (2006.01)

(52) U.S. Cl. .............................. 365/185.03; 365/185.21

(58) Field of Classification Search ............. 365/185.03
See application file for complete search history.

(56) References Cited

U.S. PATENT DOCUMENTS

| | | | | |
|---|---|---|---|---|
| 6,522,580 B2* | 2/2003 | Chen et al. | ............. | 365/185.02 |
| 6,747,894 B2* | 6/2004 | Kawamura | ............. | 365/185.03 |
| 7,492,634 B2* | 2/2009 | Li et al. | ................. | 365/185.03 |
| 7,535,767 B2* | 5/2009 | Nazarian et al. | ....... | 365/185.22 |
| 2008/0192544 A1* | 8/2008 | Berman et al. | ......... | 365/185.09 |
| 2008/0225607 A1* | 9/2008 | Achter | .................. | 365/189.07 |
| 2009/0013146 A1* | 1/2009 | Lam et al. | .................... | 711/170 |

* cited by examiner

*Primary Examiner*—Son L Mai
(74) *Attorney, Agent, or Firm*—Turocy & Watson, LLP

(57) ABSTRACT

Providing distinction between overlapping state distributions of one or more multi cell memory devices is described herein. By way of example, a system can include a calculation component that can perform a mathematical operation on an identified, non-overlapped bit distribution and an overlapped bit distribution associated with the memory cell. Such mathematical operation can produce a resulting distribution that can facilitate identification by an analysis component of at least one overlapped bit distribution associated with cells of the one or more multi cell memory devices. Consequently, read errors associated with overlapped bits of a memory cell device can be mitigated.

20 Claims, 12 Drawing Sheets

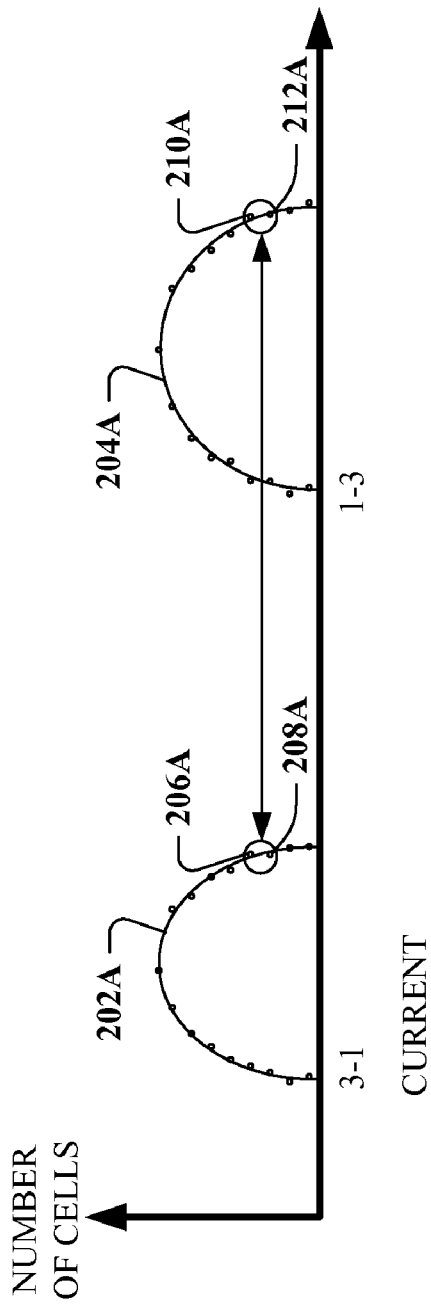
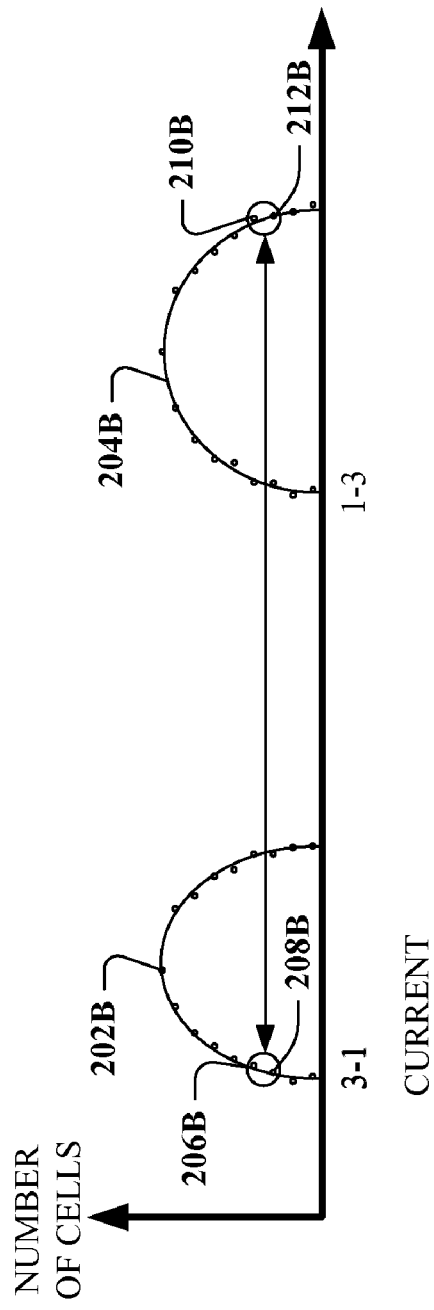
FIG. 2A
FIG. 2B

READING ELECTRONIC MEMORY UTILIZING RELATIONSHIPS BETWEEN CELL STATE DISTRIBUTIONS

BACKGROUND

Memory devices have a wide variety of uses in modern electronics, including computers, cameras, voice recorders, cell phones, portable storage drives, and similar devices. In addition, many types of memory devices have been developed to affect such uses. Flash memory, for example, is one type of electronic memory media that can store, erase and restore data. Furthermore, flash memory, unlike some types of electronic memory, can retain stored data without continuous electrical power. Flash memory has become a popular device for consumer electronics, due in part to a combination of the high density and low cost of erasable programmable read only memory (EPROM) and electrical erasability introduced with electronically erasable programmable read only memory (EEPROM). In addition to combining these benefits, flash memory is nonvolatile (e.g., flash memory can be removed from a power source without losing stored data). Consequently, it has become a useful and popular mechanism for storing, transporting, sharing and maintaining data.

To further evolve technical capabilities associated with flash memory devices, multiple storage cells have been implemented therewith. Multiple storage cells associated with a flash memory device can typically increase a density and consequently a storage capacity of such device. For example, a dual storage cell enables a single flash memory chip to store two data bits on a single chip. Some side effects can result from multi cell devices, however, as a bit (e.g., represented by a quantized voltage or current level) stored in one cell can affect a voltage or current level, representing a particular bit, of an adjacent cell. In some situations electrical characteristics associated with two different bits of a memory cell can overlap, making those bits difficult to distinguish. Such a condition can produce a memory read error resulting from an inability to distinguish between two or more bit states associated with a cell. To increase reliability and accuracy associated with flash memory, read errors should be reduced or eliminated where possible. To facilitate cell read accuracy, semiconductor suppliers have developed mechanisms to distinguish potentially overlapping cells of such multi-cell devices.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter provides for differentiating between overlapping memory cell bits in a multi-cell memory device. In accord with aspects of the claimed subject matter, a bit state of a memory cell can be differentiated from a second, overlapping bit state by performing a mathematical operation on an identified, non-overlapped bit distribution and an overlapped bit distribution associated with the memory cell. Such mathematical operation can produce a resulting distribution that can facilitate identification of at least one overlapped bit distribution associated with the memory cell. Consequently, read errors associated with overlapped bits of a memory cell device can be mitigated.

In accord with additional aspects of the claimed subject matter, overlapping bit state distributions associated with a plurality of multi-cell memory devices can be distinguished. A bit state associated with a non-overlapping bit can be uniquely identified. Subsequently, an overlapped bit distribution having certain logical relationships with the identified, non-overlapped distribution can be added or subtracted with such distribution to yield a resulting distribution with small dispersity. Such a resulting distribution can be used to identify a state of at least one overlapped bit state distribution, based on an expected result of the addition or subtraction. Memory cells corresponding to the identified overlapped bit state distribution can be disabled, facilitating identification of other overlapped bit state distributions.

In accord with particular aspects of the claimed subject matter, a set of bit state distributions can be shifted so as to render such set of distributions, or another set of distributions, to be non-overlapped. Shifting a set of distributions can occur by shifting a default program level associated with a particular bit state and re-programming cells to the shifted program level, for instance. By rendering a set of distributions to be non-overlapped, such set can be uniquely identified. Subsequently, a mathematical operation can be performed on one or more of the identified distributions and a related overlapped distribution(s) to facilitate identification of at least one overlapped bit state distribution in accord with additional aspects disclosed herein.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIG. 2 consisting of FIG. 2A and FIG. 2B, depicts example logical relationships between a bit state distribution and an adjacent bit state distribution in accord with aspects disclosed herein.

DETAILED DESCRIPTION

Figure 1:
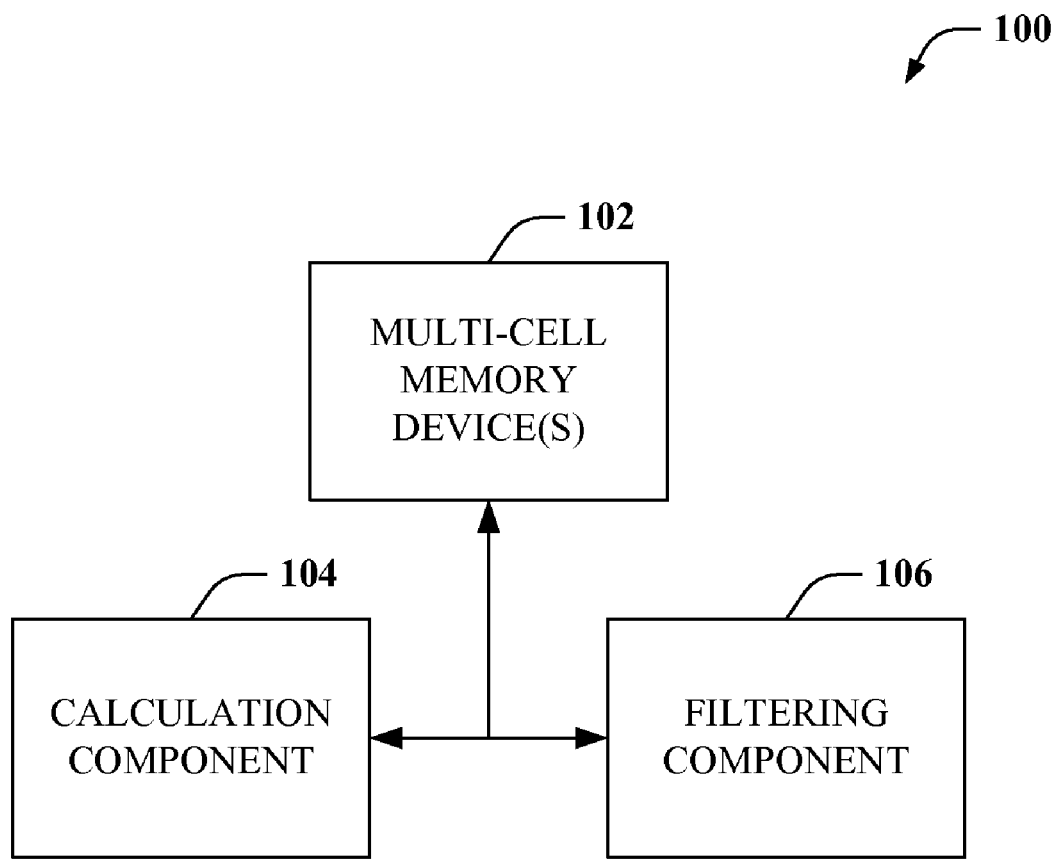
FIG. 1 illustrates a block-diagram of a system that can identify potentially overlapped bit state distributions of a multi-cell memory device in accord with aspects of the claimed innovation.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, a combination of hardware and software, software (e.g., in execution), and/or firmware. For example, a component can be a process running on a processor, a processor, an object, an executable, a program, and/or a computer. By way of illustration, both an application running on a server and the server can be a component. One or more components can reside within a process and/or thread of execution and a component can be localized on one computer and/or distributed between two or more computers. As another example, an interface can include I/O components as well as associated processor, application and/or API components, and can be as simple as a command line or a more complex Integrated Development Environment (IDE).

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The disclosed subject matter relates to systems and/or methods that facilitate accurately retrieving data in multi-bit, multi cell memory devices (e.g., quad-bit, dual cell non-volatile flash memory). In accordance with one aspect of the claimed subject matter, a calculation component can perform a mathematical operation on at least two bit state distributions associated with a plurality of such devices to generate a resulting distribution. A filtering component can employ the resulting distribution in connection with distinguishing between overlapping state distributions. Such distinction can identify a state of one or more overlapping distributions, such as a distribution operated on by the calculation component. An identified bit state distribution can then be disabled to facilitate identification of additional bit state distributions.

With reference now to FIG. 1, a block diagram of a system 100 is illustrated that can identify potentially overlapped bit state distributions of a multi-cell memory device(s) 102 (e.g., a multi-bit, dual cell device) in accord with aspects of the claimed innovation. Multi-cell memory device(s) 102 can include non-volatile memory, such as flash memory, read only memory (ROM), programmable ROM (PROM), erasable programmable read only memory (EPROM), electronically erasable programmable read only memory (EEPROM), and the like. As an example, multi-cell memory device 102 can include non-volatile memory (e.g., flash memory, multi-bit flash memory, and like memory) that further includes multi-level, multi-bit flash memory cells.

Multi-bit memory cells can typically be programmed to multiple target levels that can represent multiple data bits. As a more specific example, a quad-bit cell can be programmed to four discreet levels (e.g., B1, B2, B3, B4) corresponding to varying amounts of electric charge stored within a memory cell. Furthermore, a B1 level can correspond to an unprogrammed state (e.g., a lowest amount of electric charge), and subsequent levels, such as B2, can correspond to a programmed state having an electric charge higher than B1. Additionally, B3 can correspond to a programmed state having an electric charge higher than B1 and B2, and B4 can correspond to a highest programmed state having an electric charge still higher than B1, B2, and B3.

Each bit level (e.g., B1 through B4) of a multi-bit device can correspond to different digital information, or data. Consequently, as a cell is charged to a particular charge level, and changed to a different charge level or to the lowest charge level, writing, re-writing, and erasing, respectively, of data to multi-bit memory cell 102 can be effectuated. Furthermore, an amount of charge stored therein (e.g., a current level) can be measured and compared to discreet threshold levels (e.g., B1 through B4) that correspond to different data, to effectuate reading data stored within multi-bit memory cell 102.

In accord with aspects disclosed herein, multi-cell memory device(s) 102 can include two or more adjacent memory cells that can be independently programmed to different bit levels. For example, two adjacent cells of multi-cell memory device 102 can be programmed to an appropriate level (e.g., electric charge) representing data bit levels B1 and B2 respectively (hereinafter referred to as B1-B2 or a B1-B2 state, where B1 refers to a state of a first cell or group of cells having a lowest charge, and B2 refers to a state of a second, adjacent cell or group of cells having a slightly higher charge; it should be noted that the same B1-B2 program state is also a B2-B1 state viewed with respect to the second cell or group of cells). As stated above, B1 and B2 can indicate an unprogrammed state in one memory cell and a first programmed state in an adjacent memory cell, for instance. Typically, multi-cell memory devices (e.g., multi-cell memory device(s) 102) can exhibit a complementary bit disturbance phenomenon, where a typical bit level (e.g., level of charge) of one cell can be perturbed and shifted by a programmed bit level of an adjacent cell (e.g., when differing charges in adjacent cells partially average their respective values). More specifically, complementary bit disturbance can cause a programmed bit level of one cell to deviate from a predetermined level typically associated with the programmed bit level.

The following example illustrates a complementary bit disturbance phenomenon applicable to one or more multi-bit, multi-cell memory device(s) (102) as described above. For this example, a bit level B1 typically corresponds to an amount of charge between 5 and 7 and a bit level B2 typically corresponds to an amount of charge between 11 and 13. A first cell programmed to a B1 level and an adjacent cell programmed to a B2 level can, for instance, result in bit disturbance, such that an actual charge stored within the first cell is greater than the typical 5-7 range (e.g., 8), or an actual charge stored within the second cell is less than the typical 9-11 range (e.g., 10), or both. More specifically, a B1-B2 state can result in a bit level associated with the first memory cell between 6 and 8, a B1-B3 state in a first memory cell level between 7 and 9, and a B1-B4 state in a cell level between 8 and 10. As a result, it can be difficult to differentiate between certain bit levels, as illustrated by this example, if a shifted level nears a level corresponding to a different bit level (e.g., if the charge in the first cell overlaps the 9-11 range associated with a B2 level). It should be appreciated that the specific embodiments provided by the foregoing example are not to be construed so as to limit the disclosure; rather, like embodiments known to one of skill in the art or made known to one of skill in the art through the context provided by this example are incorporated herein.

System 100 can include a calculation component 104 that performs a mathematical operation on two or more state distributions associated with multi-cell memory device(s) 102, and generates a resulting distribution that can facilitate identification of at least one overlapped state. For example, the resulting distribution can have a dispersity (e.g., where dispersity can relate to a size or a range of bit levels that can correspond to a bit state) smaller than dispersity parameters associated with the two or more state distributions that produce the resulting distribution (e.g., via the mathematical operation). Dispersity, as used herein, is defined as a width of a distribution (e.g., a range of measured voltage values of programmed memory cells). A distribution with smaller dispersity typically overlaps fewer, if any, other distributions, and a state associated with such distribution is consequently easier to identify. As a more specific example, if a first distribution is a B3-B1 distribution having a typical charge in the range of 15-17 (e.g., having a dispersity related to the range size, or 2), and a second distribution is a B1-B3 distribution having a typical charge in the range of 7-9 (e.g., also having a dispersity related to the range size, or 2), the resulting distribution, having smaller dispersity, could have a typical charge in the range of 8-9, or 23-24 for instance (e.g., having a dispersity related to the range size of the resulting distribution, or 1).

In accord with further aspects of the claimed subject matter, the two or more state distributions utilized by calculation component 104 can be related by at least one logical relationship. Such a logical relationship can, for instance, correlate relative positions of cell bit state values on adjacent state distributions associated with a common group of cells of the multi-cell memory device(s) 102 (e.g., as depicted in more detail at FIG. 2, infra). For example, a first logical relationship can specify that a cell having a high relative position (e.g., having a cell bit value of 9 for the B1-B3 state illustrated in the previous example above) on one state distribution can have a high relative position on an adjacent state distribution as well (e.g., having a cell bit value of 17 for the B3-B1 state, adjacent to the B1-B3 state, illustrated in the previous example supra). As an additional example, a second logical relationship can specify that a cell having a high relative position on one state distribution can have a low relative position on an adjacent state distribution (e.g., cell bit value of 9 for a B1-B3 state and cell bit value of 15 for B3-B1 state).

In addition, the smaller dispersity associated with a resulting distribution, described above, can result at least in part based on the logical relationship between the two or more state distributions utilized by calculation component 104 to generate such resulting distribution. More specifically, a typical dispersity parameter of a distribution resulting from, for instance, the addition of two state distributions, can be the square root of the sum of the squares of the dispersities of the two or more state distributions. Mathematically, such a resulting distribution dispersity can be represented by the following equation:

$$\Omega_R = \sqrt{\Omega_1^2 + \Omega_2^2 + \Omega_N^2} \text{ (where } N \text{ is an integer)}$$

where $\Omega_R$=the dispersity of the resulting distribution and $\Omega_1$, $\Omega_2$, and $\Omega_N$ are the dispersities of the two or more state distributions utilized by calculation component 104 to generate the resulting distribution. A dispersity of a resulting distribution governed by the square of the sum of the squares relationship can be larger than dispersities of operated state distributions. However, where a logical relationship exists between two state distributions added, for instance, (or, e.g., subtracted, or operated in like manner) by calculation component 104, a dispersity of such resulting distribution can be much smaller than that described above. Consequently, a state of such resulting distribution can be more likely determined (e.g., by analysis component 106) as it will be less likely to overlap other distributions.

System 100 can include an analysis component 106 that can employ the resulting distribution in connection with distinguishing between overlapping state distributions of the multi-cell memory device(s) 102. Analysis component 106 can utilize a constant reference to identify a state associated with non-overlapping state distributions. A constant reference can be any constant bit level (e.g., charge, voltage, etc.) of a cell or group of cells of multi cell memory device(s) 102. As a more specific example, a constant reference (provided, e.g., by reference component 308, infra) can include, for instance, a constant measurable current, a non-varying bit, an experimentally determined level, a level inferred from another level or information related to a memory device (302), or combinations thereof. By choosing a constant reference between state distributions of one programmed bit, or group of bits, and state distributions of a second programmed bit, or group of bits, analysis component 106 can identify a program state of cells corresponding to such state distributions. It should be appreciated that a reference could be one or more of multiple referencing schemes, such as dynamic referencing schemes or a static or constant scheme, mirrored referencing scheme, etc., that can track time and/or retention, can be applied to distinguish between bit levels.

Referring to the previous example, a non-overlapping reference between bits B1, B2 (having typical and disturbed bit levels that range from 5 to 14, for instance) and bits B3, B4 (having typical and disturbed bit levels that range from 15 to 23, for instance) can be 14.5, for example. By measuring the first memory cell with respect to level 14.5, a B1/B2 bit level can be distinguished from a B3/B4 bit level, and vice versa. Consequently, if a resulting distribution generated by calculation component 104 has small dispersity (e.g., due to a logical relationship between state distributions operated on by calculation component 104) and does not overlap other distributions, analysis component 106 can identify a state related to the resulting distribution (e.g., by employing a reference).

The following example illustrates one particular aspect of the subject innovation, to provide context for the disclosure; it should be appreciated that the subject disclosure is not limited to the example embodiment. For a single dual-cell, quad-bit device 16 program states can exist (e.g., 4 variations of one cell corresponding with 4 variations of a second cell; 4×4=16 variations). For purposes of this example, 5 program states will be discussed, B1-B1, B1-B2, B1-B3, B1-B4, and B2-B1. Also for purposes of this example, typical B1-B1 and B1-B2 state distributions associated with a memory cell or group of memory cells associated with multi cell memory device(s) 102 can typically be 5-7 and 9-11, respectively (likewise, B3-B1 and B4-B1 states can typically be 13-15 and 20-22, respectively). As a result of complementary bit disturbance, discussed above, a measured level associated with the first memory cell can depend on a program state of the second memory cell. More specifically, assume for the current example that bit disturbance ranges associated with B1-B2, B1-B3, and B1-B4 levels, respectively, can typically be 6-8, 7-9, and 8-10, respectively. Consequently, a typical B1 level of the first memory cell can overlap a typical B2 level of such cell, when the second memory cell is in either a B3 or B4 state (in accord with the charge values and ranges specified via this example).

Overlapping program states associated with a cell or group of cells can first require their states be distinguished in some manner in order to identify states of such cells. Employing a calculation component (104) to produce a resulting distribution having a relatively small dispersity can facilitate such distinction. If a state of a resulting distribution can be determined, a state of one or more related distributions can be identified by inferring information from the state of the resulting distribution. For example, if calculation component 104 performs an addition operation on a first state distribution and a second state distribution, a state of a third, resulting distribution will be the sum of the states of the first and second distributions. More specifically, if a resulting distribution is determined to be a B4 state (e.g., identified by analysis component 106), and the first state distribution can be identified as a B3 state, then the second distribution (even if overlapped by other distributions) can be identified as a B1 state. Consequently, the second distribution, once identified as a particular state, can be disabled or ignored (e.g., by analysis component 106). By disabling or ignoring the second distribution, other state distributions, overlapped by the second distribution, can potentially be identified as well.

Continuing the previous example, B1 and B2 program states of a first memory cell can overlap and be indistinguishable via conventional identification methods when a second memory cell, adjacent and logically related to the first (e.g., as described in more detail at FIGS. 2A and 2B, infra), is in a B3 or B4 state. More specifically, if the first memory cell has a program level of 7-9 as a result of bit disturbance, such cell can be in either a B1 state or a B2 state, as defined by the typical B1 (5-7) and B2 (9-11) ranges. If, however, an adjacent cell can be determined to be in a B3 state (program state range of 13-15), then calculation component can perform a mathematical operation (e.g., addition, subtraction, or the like) on program level ranges associated with the first and the second cells (or, e.g., on state distributions associated with a first and second group of cells) and generate a resulting distribution. If such resulting distribution has a range substantially similar to a typical B4 state (e.g., 20-22, or the like), then the overlapped first cell range can be identified as a B1 state, instead of a B2 state. Alternatively, if such resulting distribution has a range substantially larger than a typical B4 state (e.g., 25 or higher), then the overlapped first cell can be identified as a B2 state.

As utilized herein, two adjacent cells are logically related if they have a relationship of proportionality or inverse proportionality, or the like or a suitable other relationship. It should also be appreciated that a logical relationship, as defined herein, can be enforced on adjacent cells during a programming operation. For instance, if a cell is programmed to a high end of a 2 state, an adjacent cell can also be programmed to a substantially similar relative position (e.g., a high end) of a state, whether a 1 state, 2 state, 3 state, and so on, to provide that the adjacent cells have a logical relation of proportionality. Alternatively, the adjacent cell can be programmed to a substantially inverse relative position (e.g., a low end) of the 1 state, 2 state, 3 state, etc., to enforce a logical relationship of inverse proportionality (e.g., see FIG. 2, infra).

In accord with further aspects of the claimed subject matter, calculation component 104 can perform a particular mathematical operation appropriate for a logical relationship between two state distributions to generate a resulting distribution with relatively small dispersity. If, for example, a logical relationship specifies that program states of a cell or group of cells will have a substantially opposite relative position on adjacent state distributions (e.g., discussed in further detail at FIG. 2B, infra), adding such state distributions to each other can produce a resulting distribution with relatively small dispersity. To continue the previous example, if a first program range (or, e.g., state distribution associated with a first group of cells) is 7-9, and a second program range is 13-15 (indicating, e.g., a B3 state), then a resulting distribution can be 20-21, or 21-22, or the like, indicating a typical B4 state for such resulting distribution. Alternatively, if the resulting distribution has a range of 23-24, or 24-25, or the like, it can be associated with greater than a B4 state, as described above. Other combinations of logical relations between state distributions and mathematical operations appropriate for generating resulting distributions with small dispersity are contemplated, and incorporated as part of the subject disclosure (e.g., see the discussion with respect to FIG. 2, infra, for discussion of examples).

FIGS. 2A and 2B depict example logical relationships between a first bit state distribution and an adjacent bit state distribution in accord with aspects disclosed herein. Mathematical operations appropriate for such logical relationships can generate a resulting distribution with relatively small dispersity as compared with a first and adjacent distribution. FIG. 2A depicts a logical relationship of proportionality, wherein a program state of a cell or group of cells (e.g., represented by graph points 206A, 210A and 208A, 212A) will have substantially similar relative positions on a first distribution 202A and a second, adjacent distribution 204A.

Distribution 202A indicates a number of cells of a plurality of multi-bit, dual cell memory devices having a particular current (or, e.g., charge stored within the cell representing a program state) associated with a 3-1 program state (or, e.g., a B3-B1 state as outlined above). More specifically, each point of distribution 202A indicates a number of cells having a particular current for the 3-1 state. As described supra, a 3-1 state can result from a first group of cells programmed to a bit state of 3, with adjacent cells programmed to a bit state of 1. Distribution 204A indicates a number of cells having a particular current associated with a 1-3 state (or, e.g., a B1-B3 state as outline above) of the plurality of multi-bit, dual memory devices. Each point of distribution 204A indicates a number of cells having a particular current for the 1-3 state.

The logical relationship of proportionality can be indicated by points 206A, 208A, 210A and 212A. If each of the cells having currents represented by points 206A and 208A, at a relatively high end of distribution 202A, also are represented by points having substantially similar relative positions on distribution 204A (relatively high positions on such distribution), for example as indicated by points 210A and 212A, then these cells are relatively proportional with respect to the 3-1 and 1-3 distributions. If a substantial majority of cells forming two distributions are relatively proportional, as defined herein and indicated by FIG. 2A, then subtracting such distributions will result in a distribution having a dispersity much smaller than the dispersities of the 202A and 204A distributions. Consequently, a program state related to the resulting distribution can be easier to identify.

In accord with additional aspects of the claimed subject matter, a state of a resulting distribution can be used to infer an unknown state of distribution 202A and/or distribution 204A. As an example to illustrate such inference, distribution 202A is known to represent cells having a 3 state, but distribution 204A represents cells whose bit levels overlap the 1 and 2 states. Since distributions 202A and 204A are substantially related by a logical relationship of proportionality, subtracting distributions 202A and 204A can generate a resulting distribution with relatively small dispersity. If the resulting distribution does not overlap other distributions, and consequently its state can be identified (e.g., via comparing with a reference, as described by analysis component 106, supra), then distribution 204A can also be identified. More specifically, if the resulting distribution corresponds to a 2 state, then distribution 204A can correspond to the difference of the resulting distribution state and 202A distribution state (e.g., a 2 state subtracted from a 3 state can result in a 1 state, corresponding to 204A). Alternatively, if the resulting distribution corresponds to a 1 state, then distribution 204A can be identified as a 2 state.

FIG. 2B illustrates an alternate logical relationship as compared with FIG. 2A, a relationship of inverse proportionality. To illustrate, distribution 202B depicts a number of cells of a plurality of multi bit, multi cell memory devices having a particular current associated with a 3-1 program state. More specifically, each point of distribution 202B indicates a number of cells having a particular current for the 3-1 state. Distribution 204B indicates a number of cells having a particular current associated with a 1-3 state of the plurality of multi-bit, dual memory devices. Each point of distribution 204B indicates a number of cells having a particular current for the 1-3 state.

The logical relationship of inverse proportionality can be indicated by points 206B, 208B, 210B and 212B. If each of the cells having currents represented by points 206B and 208B, at a relatively low end of distribution 202B, are represented by points having substantially opposite relative positions on distribution 204B (relatively high positions on such distribution), for example as indicated by points 210B and 212B respectively, then these cells are relatively inverse proportional with respect to the 3-1 and 1-3 distributions. If a substantial majority of cells forming two distributions are relatively inverse proportional, as defined herein and indicated by FIG. 2B, then adding such distributions will result in a distribution having a dispersity much smaller than the dispersities of the 202B and 204B distributions. Consequently, a program state related to the resulting distribution can be easier to identify.

The following example illustrates identification of an unknown state based on a logical relationship of inverse proportionality with a known state. Distribution 202B is known to represent cells having a 3 state, but distribution 204B represents cells whose bit levels overlap the 1 and 2 states. Since distributions 202B and 204B are substantially related by a logical relationship of inverse proportionality, adding distributions 202B and 204B can generate a resulting distribution with relatively small dispersity. If the resulting distribution does not overlap other distributions, and consequently its state can be identified (e.g., via comparing with a reference, as described by analysis component 106, supra), then distribution 204B can also be identified. More specifically, if the resulting distribution corresponds to a 4 state, then distribution 204B can correspond to the difference of the resulting distribution state and 202B distribution state (e.g., a 4 state subtracted from a 3 state can result in a 1 state, corresponding to 204B). Alternatively, if the resulting distribution corresponds to a 5 state, then distribution 204B can be identified as a 2 state. It should be appreciated that other logical relationships can exist that, when used in conjunction with an appropriate mathematical operation, produce a resulting distribution of relatively small dispersity. Such relationships and operations, known in the art or made known to one of skill in the art by way of the context provided herein, are incorporated within the subject disclosure.

Figure 3:
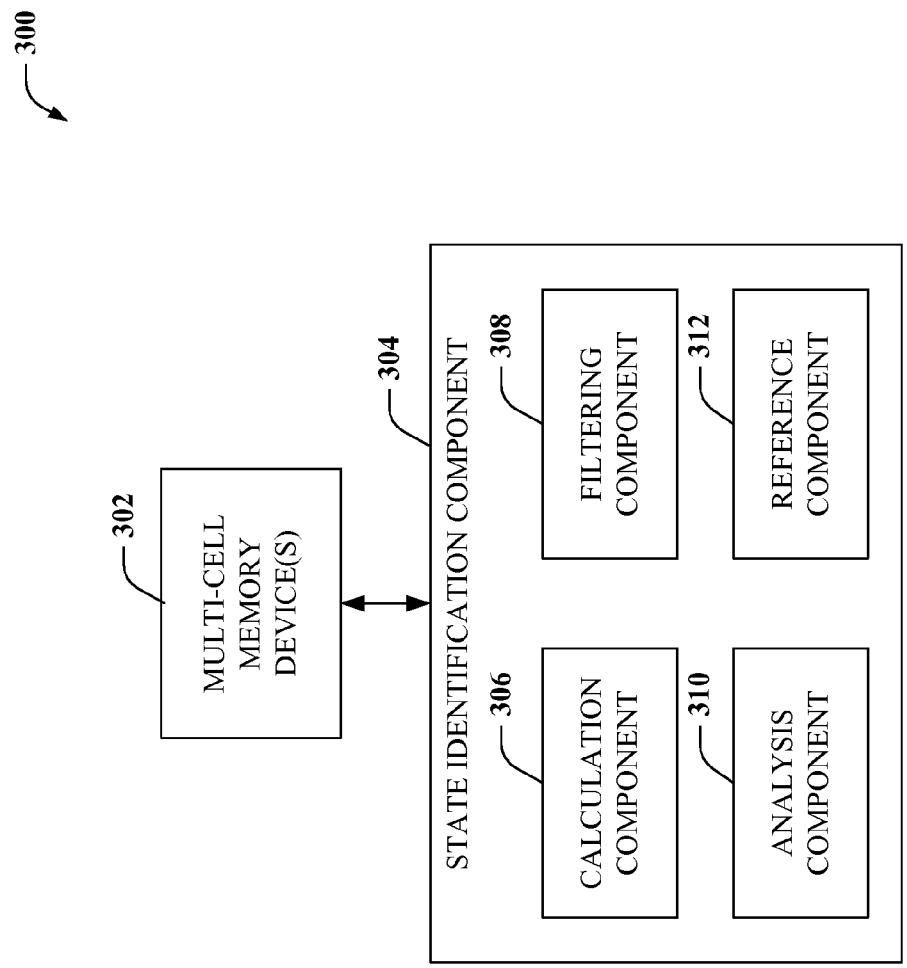
FIG. 3 illustrates a sample block diagram of a system that can identify potentially overlapped bit state distributions by applying and analyzing such distributions with respect to a reference.

FIG. 3 illustrates a sample block diagram of a system 300 that can identify potentially overlapped bit state distributions by applying and analyzing such distributions with respect to a reference. State identification component 304 can analyze state distributions associated with multi cell memory device(s) 302, identify states of non-overlapping distributions by comparison to a reference. Additionally, state identification component 304 can distinguish at least one overlapping distribution by mathematically operating on such a distribution and a known distribution to generate a resulting distribution. Determination of a state of the resulting distribution can facilitate determination of a state of the unknown distribution and other distributions.

System 300 can employ an analysis component 306 that can compare a non-overlapped distribution to a reference, and determine a state of such a distribution. The reference can be provided by a reference component 308, which can iteratively choose a plurality of references (e.g., associated with a charge, current, voltage, etc., of a system or memory cell) bounded by non-overlapping cell bit distributions. In reference to the example presented in FIG. 1, supra, a reference bounded by non-overlapping cell bit levels for non-shifted B1 and B2 states (e.g., B1-B1 and B2-B1 states) can be a bit level of 8. A reference provided by reference component 308 can include, for instance, a constant measurable current, a non-varying bit, an experimentally determined level, a level inferred from another level or information related to a memory device (302), or combinations thereof.

Calculation component 310 can perform mathematical operations on known and unknown distributions to facilitate identification of a state of the unknown distribution. An unknown distribution can be a distribution corresponding to a first state that overlaps a distribution corresponding to a second state, where conventional techniques are insufficient to distinguish such distributions (e.g., a B1-B3 or B1-B4 state of the example provided in FIG. 1, supra, where such states overlap the B2-B1 state). The known distribution can be, for instance, a distribution whose state is identified via analysis component 306 and reference component 308, as outlined above. The mathematical operation(s) can result in a third distribution, different from the known and unknown distributions. Additionally, the third distribution can have a dispersity parameter lower than dispersities of the known and unknown distributions (e.g., where such distributions are related by a logical relationship of proportionality or inverse proportionality, or the like, as indicated above). Consequently, a state corresponding to the third distribution can be identified and such state can be utilized (e.g., by analysis component 306) to infer a state of the unknown distribution.

Filtering component 312 can disable known state distributions to help further determine states associated with other unknown (e.g., overlapped) state distributions. For example, if a B1-B4 state of a quad bit, dual cell memory device overlaps a B2-B1 state, identifying and disabling the B1-B4 state can subsequently render the B2-B1 state non-overlapped. Consequently, cells programmed to levels corresponding to a B2 state can at least be distinguished from a B1 state by analyzing such cells with respect to a reference (e.g., provided by reference component 308) bisecting the B1 and B2 bit states. Therefore, state distributions identified by analysis component 306 (e.g., by utilizing a state of a resulting distribution, determined as described herein) can be disabled to facilitate state identification of distributions overlapped by the disabled distribution. In such a manner, state identification component 304 can distinguish potentially overlapping state distributions of multi-cell memory device (s) 302, in accordance with aspects of the claimed subject matter.

Figure 4:
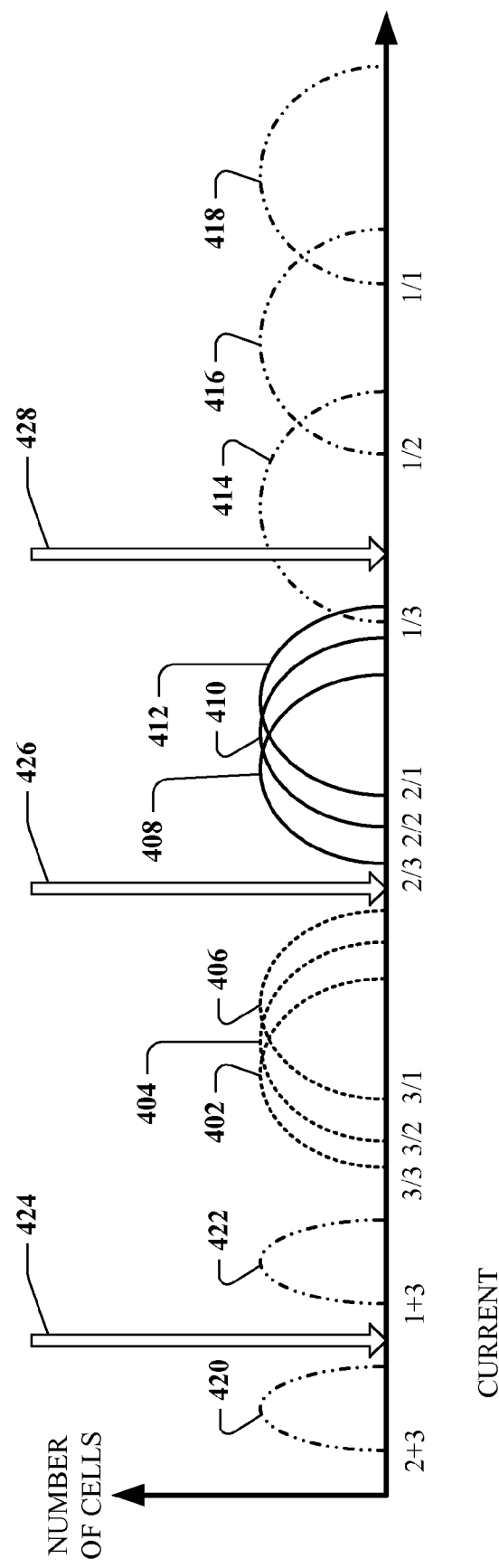
FIG. 4 depicts a sample relationship between bit state distributions and reference points used to distinguish such distributions in accord with aspects of the subject innovation.

FIG. 4 illustrates an example relationship between bit state distributions and reference points used to distinguish such distributions in accord with aspects of the subject innovation. The example depicted in FIG. 4 refers to a plurality of tri-bit, dual cell memory devices, however, other suitable multi bit, multi cell memory devices not specifically delineated herein, within the spirit and scope of the claims, are incorporated in the subject specification. The graph in FIG. 4 depicts distributions of numbers of memory cells having particular current values for various programmed states. Distributions 402, 404, and 406 refer to programmed 3/3, 3/2, and 3/2 states respectively. Such distributions illustrate the complementary bit disturbance phenomenon discussed supra. More specifically, the current values of the 3/2 and 3/1 distributions are shifted toward the 2 and 1 bit states on the graph. Note, that with respect to FIG. 4, sub-state distributions of a state (e.g., 3/1, 3/2, 3/3 distributions of the 3-state) are depicted via a slash '/' instead of '−' utilized elsewhere in the subject specification. Such a convention is utilized with respect to FIG. 4 to distinguish sub-state distributions from mathematically operated resulting distributions, such as a 2+3 distribution (420), 1+3 distribution (422), or other distributions such as a subtracted resulting distribution (e.g., 3-1 distribution (not shown) or 3-2 distribution (not shown)) or like resulting distributions.

Distributions 408, 410, 412, and 414, 416, and 418 illustrate programmed 2/3, 2/2, 2/1, and 1/3, 1/2, and 1/1 states respectively. Each of the 2-state (408, 410, 412) and 1-state (414, 416, 418) distributions exhibit a complementary bit disturbance, most notably the 1-state. The degree of disturbance for each state is depicted by the amount of separation between distributions of a common state. More specifically, the separation in current between the 3/3 (402), 3/2 (404), and 3/1 (406) states illustrates the degree of disturbance associated with the 3-state distributions (402, 404, 406). For the example depicted in FIG. 4, the 1-state (414, 416, 418) distributions experience a much greater degree of bit disturbance, which can by typical for multi cell memory devices. However, this is but one example embodiment, and many suitable variations on the complementary bit disturbance among program states can exist within the spirit and scope of the subject disclosure.

FIG. 4 further depicts a 2+3 distribution 420 and a 1+3 distribution 422. Such distributions can result, for instance, from a mathematical operation (e.g., an addition operation) performed upon two or more other program state distributions having a logical relationship (e.g., as described at FIG. 2, supra). As a specific example, addition of a 1-state (414, 416, 418) distribution and a 3-state (402, 404, 406) distribution can produce a 1+3 (422) distribution. Furthermore, addition of a 3-state (402, 404, 406) and a 2-state (408, 410, 412) distribution can produce the 2+3 (420) distribution. As long as corresponding states of the 2+3 state distribution 420 and the 1+3 state distribution 422 can be distinguished from each other (e.g., as long as they do not overlap each other) and from other distributions, knowledge of such a state can be used to facilitate state identification of other unknown, overlapped state distributions.

A specific example of utilizing 1+3 state 422 and 2+3 state 420 to determine unknown distribution states can be as follows. As depicted, the 1/3 state distribution 414 overlaps the 2/1 state distribution 412. This can make the 2-state and 1-state distributions indistinguishable by conventional methods, as a reference point between such distributions that identify a state related thereto does not exist. The 3-state distributions (402, 404, 406), however, are not overlapped by the 2-state or 1-state distributions (408, 410, 412, and 414, 416, 418 respectively), and consequently, a reference point 426 (e.g., constant current level, constant bit, etc.) bisecting the 3-state distributions and 2-state distributions can facilitate identification of a cell as a 3-state distribution (e.g., via analysis component 306).

Once a state of a particular distribution is determined, mathematically operating on such a state and an unknown state can produce a resulting distribution. If a state of the resulting distribution can subsequently be determined, such determination can be utilized to infer a state of the one or more unknown distributions. More specifically, a known 3-state distribution can be added (or, e.g., subtracted, multiplied, divided, etc.) with an unknown distribution to produce a resulting distribution. A state of distribution resulting from such addition can consequently be the sum of the states of the added distributions, or, represented mathematically:

$S_R$=3+'x' (where x can be an unknown state of a distribution added to the known 3-state distribution, and $S_R$ is the state of the resulting distribution).

If a state of the resulting distribution can be determined, for example via reference point 424 and/or similar reference point(s) bisecting the resulting distribution and other distributions, then the foregoing equation can be solved for 'x' to provide the state of the unknown distribution. More specifically, if the state of the resulting distribution is determined to be 4, then the foregoing equation provides that x=4−3, or 1. In such case, the unknown distribution is a 1-state distribution (414, 416, 418). Alternatively, if the resulting distribution is determined to be 5, then the foregoing equation provides that x=5−3, or 2. In such case, the unknown distribution is a 2-state distribution (408, 410, 412). Once an overlapped state of a group of cells forming a set of state distributions is determined, sub-states (e.g., 1/1, 1/2, 1/3 states of a 1-state distribution) can also typically be determined by conventional techniques, such as measuring values of the adjacent cells, (e.g., by way of measurement component 506, discussed in more detail at FIG. 5 infra, or like techniques), and/or by iteratively repeating the above and/or like mathematical operation(s) on subsequent sub-state distributions having logical relationships, as defined herein or the like.

Once a state of a state distribution is determined, it can be disabled to facilitate distinction of further unknown state distributions. For example, if a state of the 1/3 distribution 414, overlapping the 2/1 distribution 412, is determined (e.g., utilizing reference point 428 and a suitable analysis component, such as analysis component 306 discussed supra), it can be disabled. Subsequently, any reference point bisecting the 1/2 distribution 412 and 2/1 distribution 416, such as reference point 428, can facilitate identification of 1-states and 2-states. In the subject example depicted at FIG. 4, identifying and disabling a distribution of a highly disturbed state (e.g., the 1-state distributions, as discussed above) can typically be most beneficial in facilitating identification of overlapped states, as such disturbed states are typically more likely to overlap other states.

In addition to the complementary bit disturbance phenomena discussed above, dispersity parameters of state distributions can cause distributions to overlap. A dispersity parameter relates to a width of a distribution, or for example, a range of current that can correspond to a particular state. As depicted by the sample graph of FIG. 4, the 1-state distributions (414, 416, 418) illustrate an example of relatively high dispersity as compared with the 3-state (402, 404, 406) and 2-state (408, 410, 412) distributions. Such relatively high dispersity can be a cause of overlap, as seen with the 2/1 and 1/3 distributions. Put differently, states of distributions with smaller dispersities can be easier to identify than those with larger dispersities, as such smaller dispersity distributions are less likely to overlap related distributions.

The 2+3 distribution 420 and the 1+3 distribution 422 both have relatively small dispersities as compared with all other state distributions depicted (402-418). Specifically, such small dispersity can result from a logical relationship (e.g., proportionality or inverse proportionality, or the like, discussed supra) between two distributions (402-418) and an appropriate mathematical operation (e.g., addition for distributions related by inverse proportionality, subtraction for distributions related by proportionality, or like operation/relation pairs) utilized to generate a resulting distribution (420, 422). As specified above, a mathematically generated resulting distribution can facilitate identification of at least one unknown state utilized to produce such distribution, if a state of the resulting distribution can be distinguished from other potential states. More specifically, in regard to the example depicted in FIG. 4, if a 1+3 distribution (422) can be distinguished from a 2+3 distribution, then $S_R$ can be determined for solving the equation:

$$S_R = 3 + \text{'x'}$$

Small dispersities of resulting distributions (420, 422) make states of such distributions easier to identify (e.g., via reference point 424), and consequently can provide more information with which to identify states of overlapped state distributions (e.g., 2-state and 1-state distributions, as depicted in FIG. 4).

Figure 5:
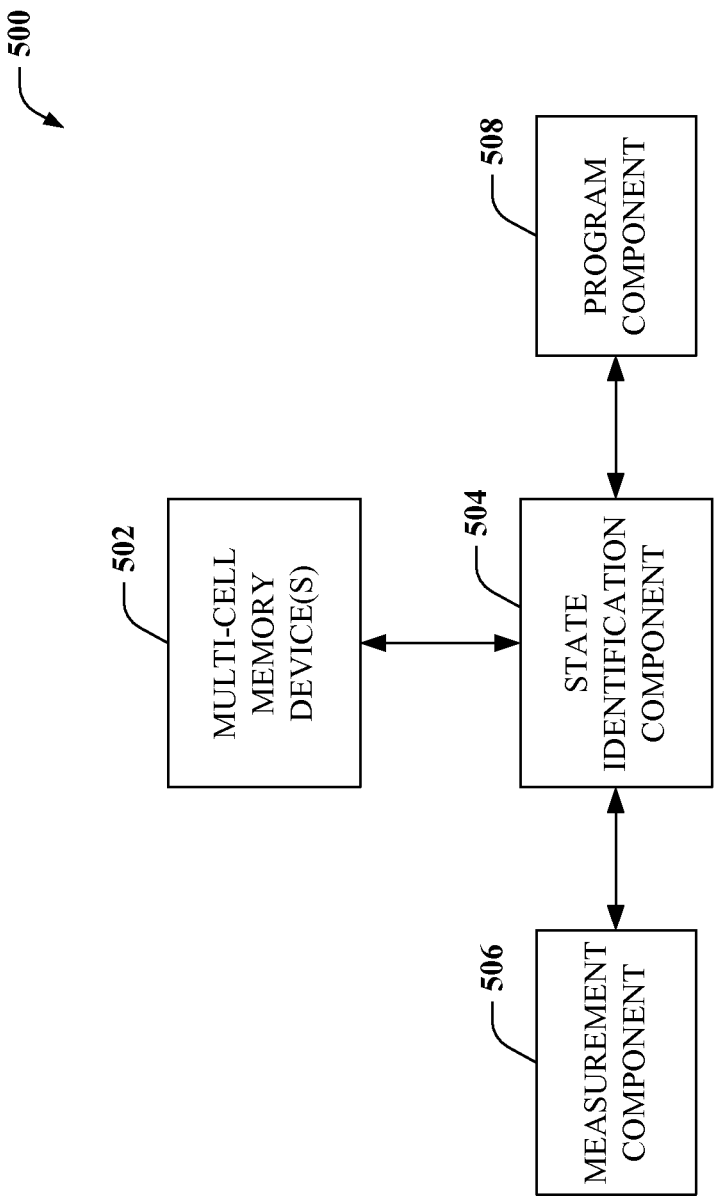
FIG. 5 illustrates an example block diagram of a system that can shift and measure a set of bit state distributions to facilitate identification of one or more states associated with such distributions in accord with aspects disclosed herein.

FIG. 5 depicts an example block diagram of a system 500 that can shift and measure a set of bit state distributions to facilitate identification of one or more states associated with such distributions in accord with aspects disclosed herein. State identification component 504 can identify a state of overlapping distributions as described herein. More specifically, state identification component 504 can identify a state of a non-overlapping distribution, and mathematically operate on such distribution and an unknown distribution to produce a resulting distribution. Subsequently, state identification component 504 can determine a state of the resulting distribution and utilize the state to infer a state of the unknown distribution, as discussed herein. Additionally, state identification component 504 can identify a logical relationship (e.g., proportionality and/or inverse proportionality, or the like) between the known and unknown state distributions, and perform an appropriate mathematical operation such that the resulting distribution has relatively small dispersity, and consequently a state of which can be distinguished more easily from other potential states.

In addition, system 500 can adjust a set of state distributions corresponding to a program state to facilitate identification of a state of at least one state distribution. For example, measurement component 506 can identify state levels (e.g., value of current, charge, voltage, etc., stored within a cell or group of cells) of cells of multi cell memory device(s) 502, and program component 508 can alter default state levels corresponding to a particular state, and reprogram states of cells to such new current levels. Measurement component 506 can include, for example, a device or process, or combination of a device and process that can measure a current, voltage, charge, or like electronic characteristic, or similar electronic measurement component that can measure such characteristic. As a more specific example of adjusting state distributions, if a first state (S1) corresponds to a range of 5-9, a second state (S2) corresponds to a range of 11-13, and a third state (S3) corresponds to a range of 13-15, overlapping the second state, then program component 508 can alter the state levels of the second state to 10-12 and reprogram them accordingly. Consequently, state identification component 504 can identify a state of distributions corresponding to the specified ranges, for instance, by choosing reference points at 9.5, 10.5, 12.5, or the like.

Some situations can exist where shifting a program state (e.g., by altering default state levels and reprogramming corresponding cells to the altered level) can be insufficient to facilitate distinction of all states. For example, if a 2/1 distribution of a 2-state overlaps a 1/3 distribution of a 1-state (e.g., as depicted at 412 and 414 of FIG. 4), and a 2/3 distribution of the 2-state also overlaps a 3/1 distribution, then all states can be indistinguishable from each other. However, in certain circumstances (discussed in more detail at FIG. 6, infra) if a 2-state can be shifted further into the 1-state (or, e.g., further into the 3-state) to separate the 2-state and the 3-state, and so that the 2/3 state is not overlapped by the 1/3 state, the 3-state can still be distinguished (as discussed supra) and state identification component 504 can then distinguish at least one overlapped state as specified above (e.g., mathematically operating on a 3-state and unknown state distribution, identifying a state of the resulting distribution, and inferring a state of the unknown distribution). Consequently, system 500 can provide flexibility for state identification, as discussed herein, by shifting state distributions to cause at least one state to be non-overlapped and distinguishable by state identification component 504.

Figure 6A:
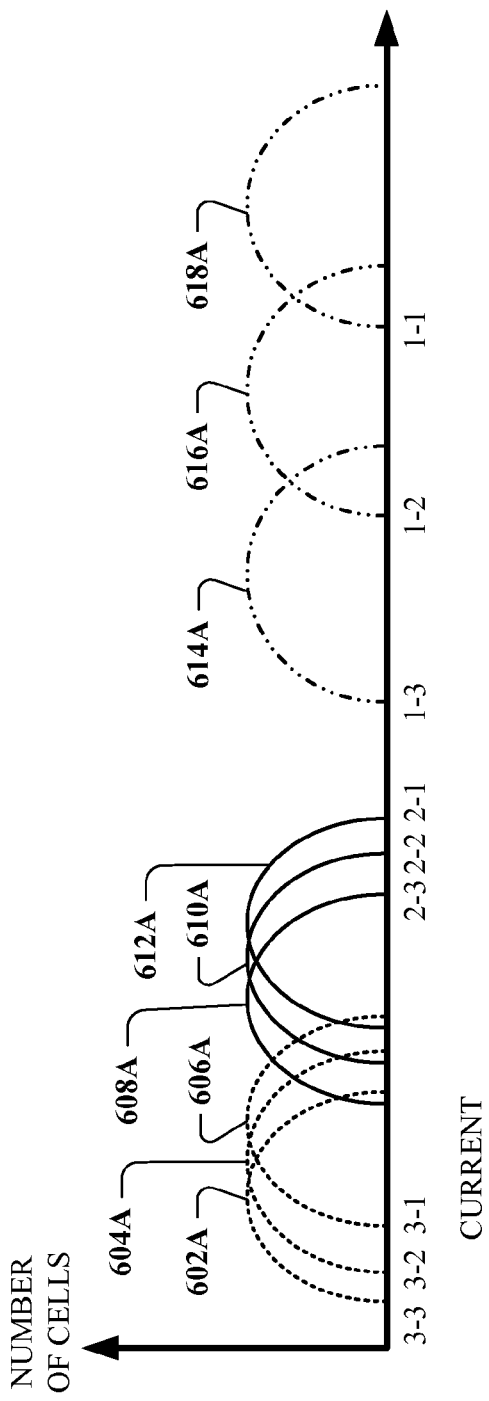
FIG. 6 consisting of FIG. 6A and FIG. 6B, depicts an example set of bit state distributions wherein shifting such distributions can facilitate identification of a state associated with one or more distributions.
Figure 6B:
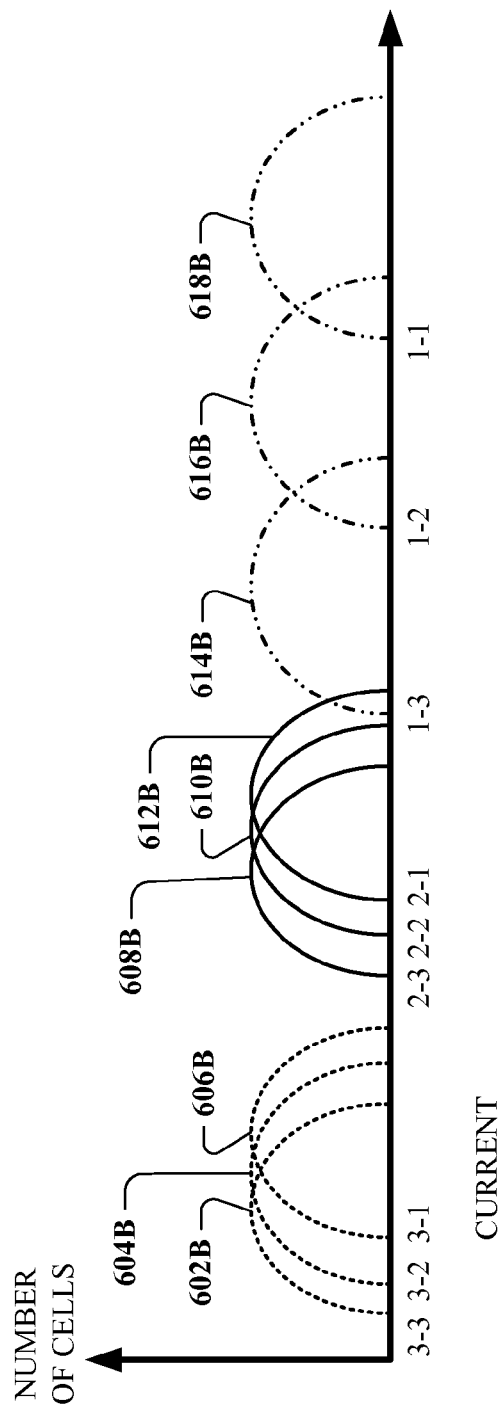

FIGS. 6A and 6B depict an example set of bit state distributions wherein shifting such distributions can facilitate identification of a state associated with one or more distributions. FIG. 6A illustrates an example scenario where all 3-state distributions (602A, 604A, 606A) overlap at least one 2-state distribution (608A, 610A, 612A), making all 2-state and 3-state distributions (602A, 604A, 606A, and 608A, 610A, 612A, respectively) indistinguishable by conventional methods. However, due to the wide dispersity and high disturbance associated with the 1-state distributions (614A, 616A, 618A), the 2-state distributions can be shifted (e.g., by program component 508 discussed supra) substantially to facilitate identification of 2 and 3 states, without fully overlapping the 1-3 state distribution.

FIG. 6B illustrates an example scenario where the 2-state distributions (608A, 610A, 612A) have been shifted (e.g., as described supra) to fully distinguish the 2 and 3-states, without overlapping more than the 2-1 (612B) and 1-3 (614B) states. As mentioned, the disparity in bit disturbance illustrated by the 1-state distributions (614B, 616B, 618B) and the 2-state and 3-state distributions (602A, 604A, 606A, and 608A, 610A, 612A, respectively) facilitate such scenario. Additionally, such disparity can be typical of 1-state distributions (614B, 616B, 618B) as compared with higher state distributions (602A, 604A, 606A, 608A, 610A, 612A, or the like). Consequently, shifting a state and corresponding distributions can facilitate distinction of at least one state and corresponding state distributions to distinguish unknown distributions as described herein. For instance, by shifting a state and corresponding distribution overlapped states can be selected. By selecting states to overlap that also have a logical relationship as defined herein, the selected states can further be distinguished by applying a mathematical operation to such overlapped and logically related states, as discussed herein. Additionally, it should be appreciated that the 2-state distribution can be shifted further into the 1-state distribution, so long as the 2-3 state (608B) and 1-3 state (614B) distributions do not overlap, in accord with distinguishing overlapping 1-state and 2-state distributions (608A, 610A, 612A, and 614B, 616B, 618B, respectively) as described herein.

FIGS. 7-10 illustrate example methodologies in accordance with the disclosed subject matter. For purposes of simplicity of explanation, the methodologies are depicted and described as a series of acts. It is to be understood and appreciated that the claimed subject matter is not limited by the acts illustrated and/or by the order of acts, for acts associated with the example methodologies can occur in different orders and/or concurrently with other acts not presented and described herein. For example, those skilled in the art will understand and appreciate that a methodology could alternatively be represented as a series of interrelated states or events, such as in a state diagram. Moreover, not all illustrated acts can be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers.

Figure 7:
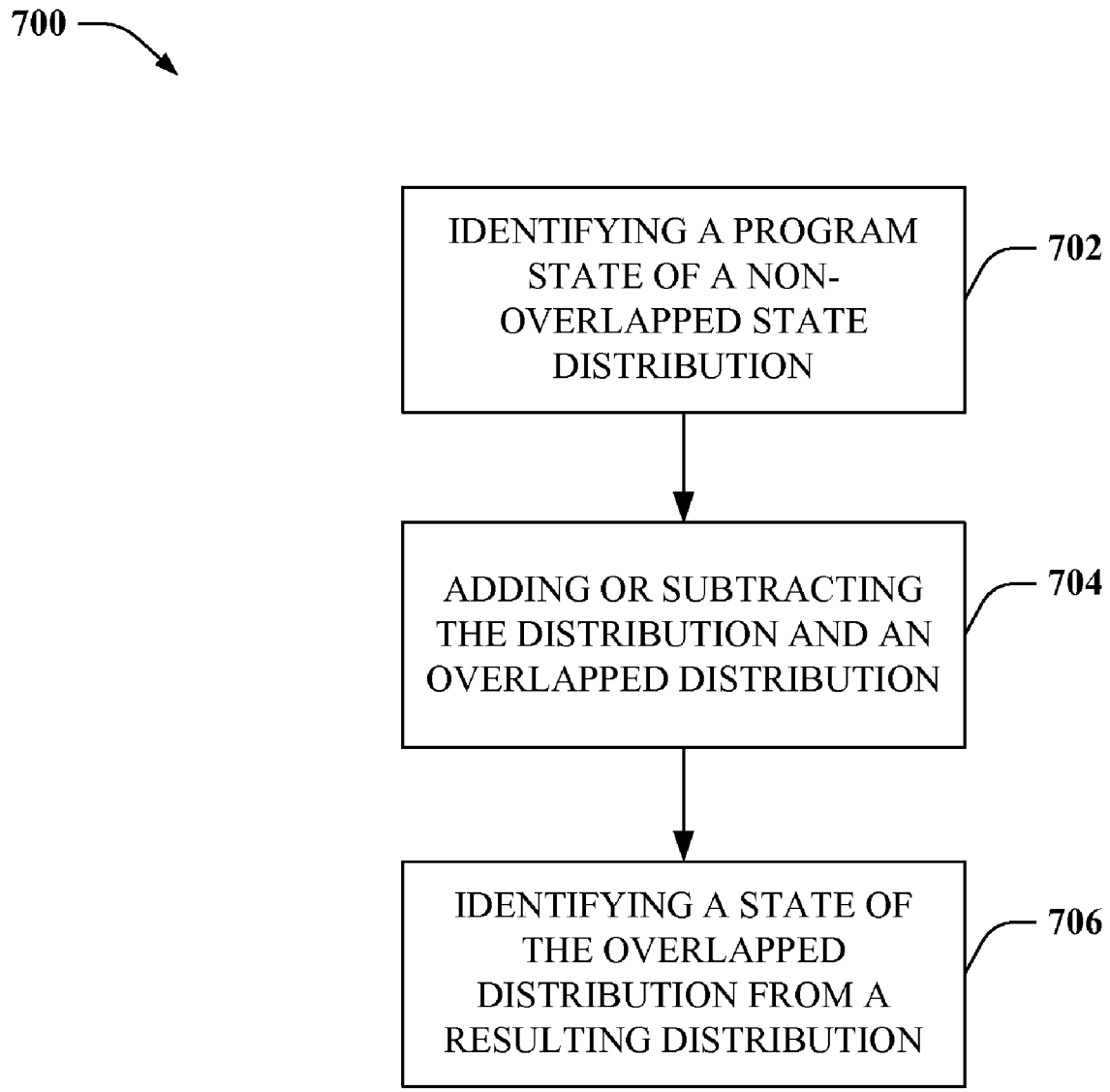
FIG. 7 illustrates a sample methodology for identifying potentially overlapped bit state distributions in accord with aspects of the claimed subject matter.

FIG. 7 illustrates a sample methodology for identifying potentially overlapped bit state distributions in accord with aspects of the claimed subject matter. At 702, a program state of a non-overlapped state distribution is identified. Such state distribution can correspond to program levels of a cell or group of cells of a plurality of multi cell memory devices. Such multi-cell memory devices can include non-volatile memory, such as flash memory, ROM, PROM, EPROM, EEPROM, and the like. Furthermore, such multi-cell memory devices can include multi-level, multi-bit flash memory cells that can typically be programmed to multiple target levels that can represent multiple data bits. As a more specific example, a cell of a multi cell memory device can be programmed to multiple bit states, such as a quad-bit cell that can be programmed to four discreet levels (e.g., B1, B2, B3, B4) corresponding to varying amounts of electric charge stored within a memory cell. For example, B1 can correspond to an unprogrammed state, B2 to a programmed state having an electric charge higher than B1, B3 to a programmed state having an electric charge higher than B1 and B2, and B4 to a highest programmed state having an electric charge still higher than B1, B2, and B3.

Identification of a program state in accord with reference number 702 can be performed by an analysis component that can utilize a reference to identify a state associated with non-overlapping state distributions. A reference can be any constant bit level of a cell or group of cells that bisects distributions corresponding to one state from distributions corresponding to another state. Consequently, the reference can distinguish, for example, between threshold levels or groups of levels that overlap and other threshold levels or groups of levels that do not overlap. An analysis component utilizing such a reference can therefore identify a state of at least one non-overlapping distribution.

At 704, the non-overlapped state distribution is added or subtracted with an overlapped distribution. Adding or subtracting such distributions at reference number 704 can generate a resulting distribution. Moreover, the resulting distribution can provide information that can be utilized to infer a state of the overlapped distribution. More specifically, states of the known, unknown and resulting distributions can be related depending on addition or subtraction. As an example, states of distributions added to generate a resulting distribution can be related to a state of the resulting distribution by the following formula:

$S_R = S_K + S_U$ (where $S_R$ is the state of the resulting distribution, $S_K$ is the state
of the known distribution, and $S_U$ is the state of the unknown distribution)

As a further example, states of distributions subtracted to generate a resulting distribution can be related to a state of the resulting distribution by the following formula:

$$S_R = S_K - S_U.$$

At 706, a state of the overlapped distribution is determined from a resulting distribution. Such state can be determined, for example, by the equations described above. More specifically, if a state of the resulting distribution can be determined, then the state of the unknown distribution can be solved for utilizing the examples stated above. It should be appreciated that the subject methodology provides but one example of facilitating distinction of at least one overlapping state distribution associated with a plurality of multi cell memory devices, and that other examples within the spirit and scope of the subject specification are incorporated herein.

Figure 8:
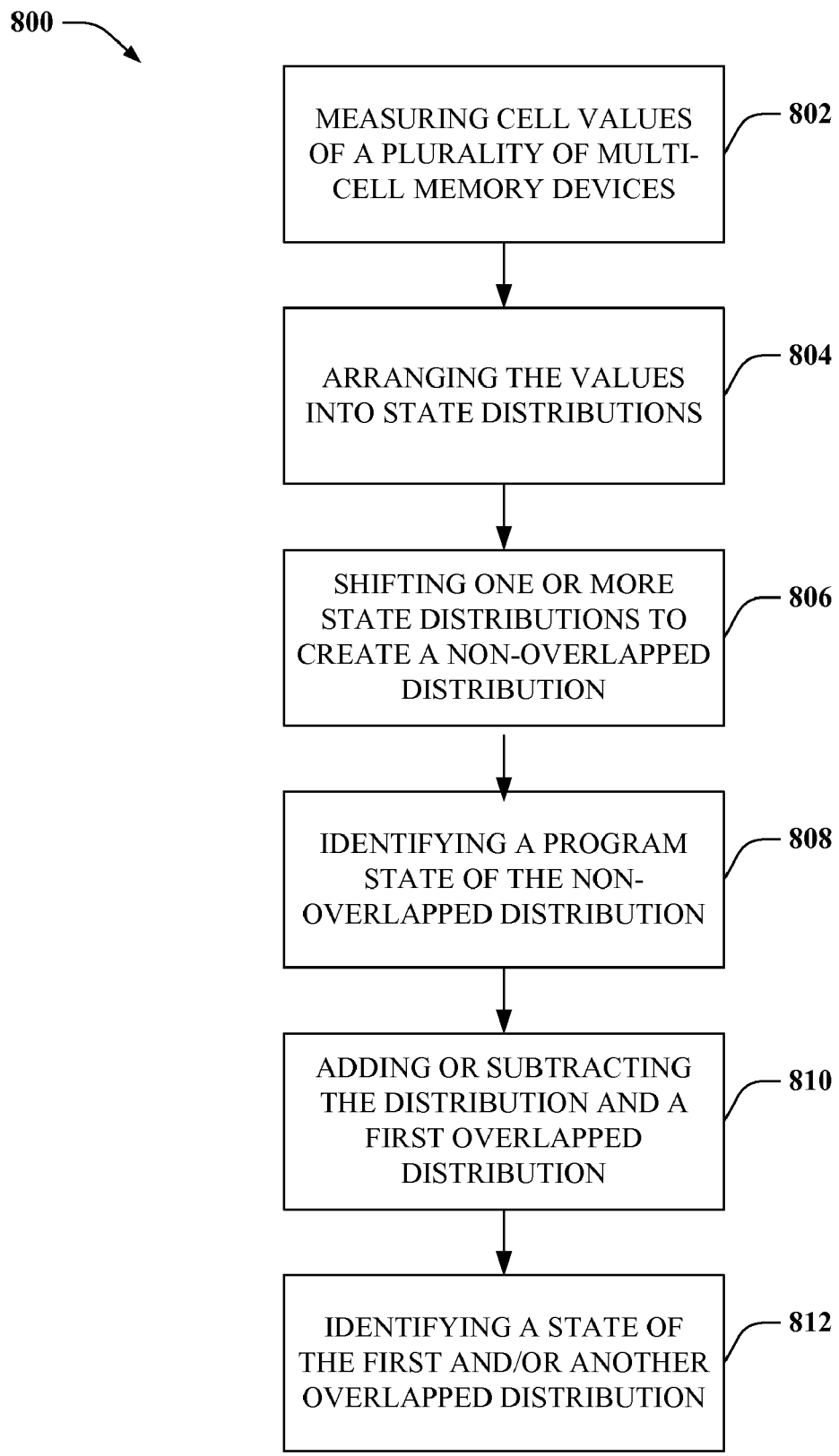
FIG. 8 depicts a sample methodology for measuring, shifting, and identifying states of bit state distributions of a plurality of multi-cell memory devices in accord with aspects disclosed herein.

FIG. 8 depicts a sample methodology for measuring, shifting, and identifying states of bit state distributions of a plurality of multi-cell memory devices in accord with aspects disclosed herein. At 802, cell values of a plurality of multi cell memory devices are measured. Such measurement can be performed, for example, by a measuring component including a device, process, or electronic component or combination thereof that can measure a current, voltage, charge, or like electronic characteristic. It is to be appreciated that cell level distributions can overlap other level distributions, making corresponding levels indistinguishable by conventional mechanisms.

At 804, values measured at reference number 802 are arranged into state distributions. It is to be appreciated that cell level distributions can overlap other level distributions, making corresponding levels indistinguishable by conventional mechanisms. At 806, one or more state distributions are shifted to create a non-overlapped distribution. At 808, a program state of the non-overlapped distribution is identified. Such identification can be via an analysis component, as described herein, utilizing a reference that bisects the non-overlapped distribution and related distributions. Consequently, the one or more state distributions shifted at reference number 806 can facilitate identification of such a reference and the resulting identification of the non-overlapped distribution at reference number 808.

At 810, the non-overlapped distribution is added or subtracted from a first overlapped distribution. Such addition or subtraction can produce a resulting distribution. Additionally, where such non-overlapped and overlapped distributions are related by a logical relationship (e.g., relationship of proportionality or inverse proportionality, as described herein, or like relationship), the resulting distribution can have a relatively small dispersity parameter associated with it, making a state corresponding to such distribution more easily identified from other potential resulting distributions. At 812, a state of the first and/or another overlapped distribution can be identified. For example, a state of the first unknown distribution can be solved for via the state of the known distribution and the state of the resulting distribution as described herein. Additionally, once the state of the unknown distribution is identified, such distribution can be disabled, and a reference chosen that bisects state distributions overlapped by the unknown distribution (e.g., as indicated by reference point 428 of FIG. 4) to facilitate identification of states of such bisected distributions.

Figure 9:
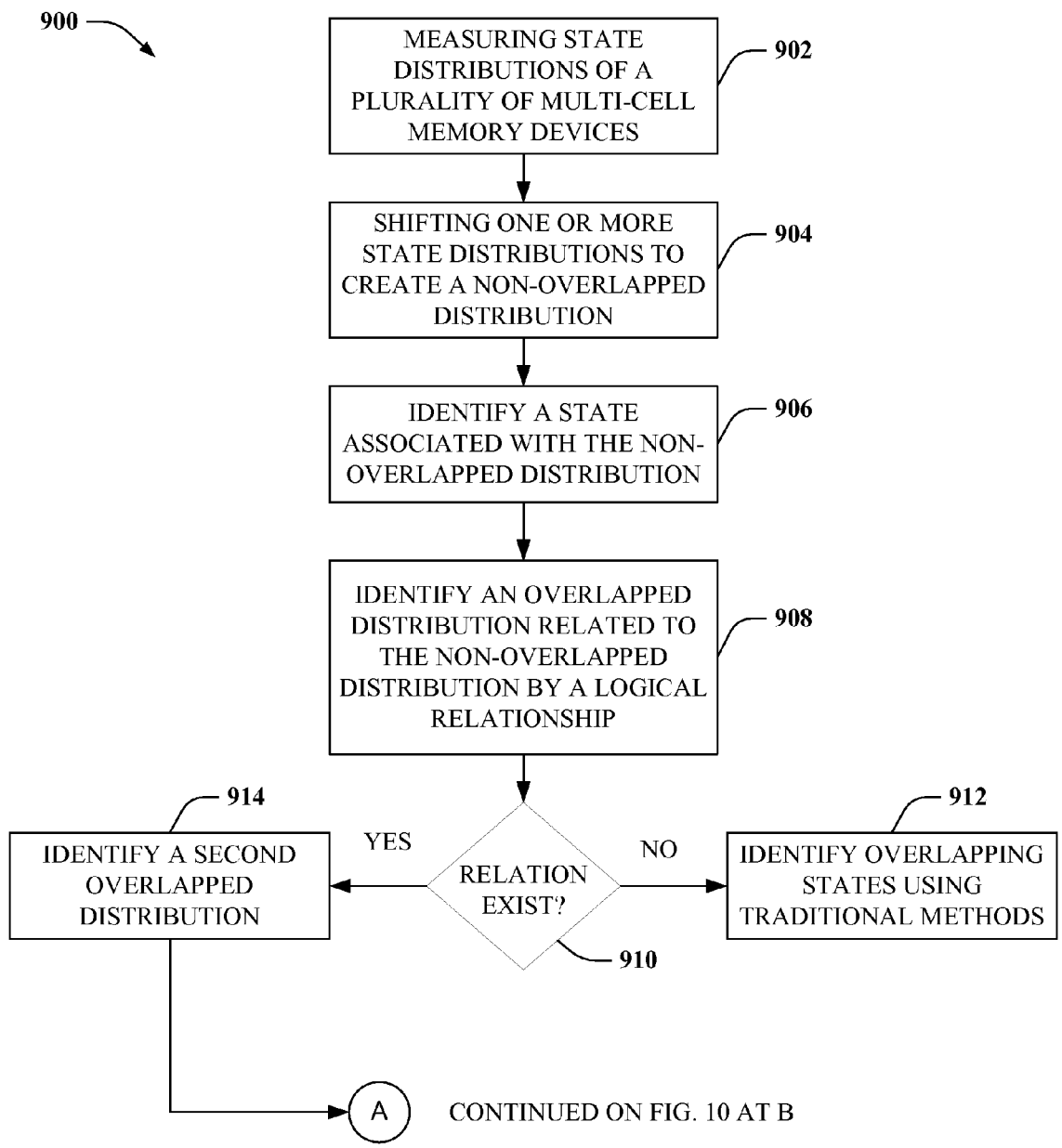
FIGS. 9 and 10 depict a flowchart of an exemplary methodology for utilizing logical relationships between state distributions to distinguish between overlapping distributions of dual cell memory devices in accord with aspects disclosed herein.
Figure 10:
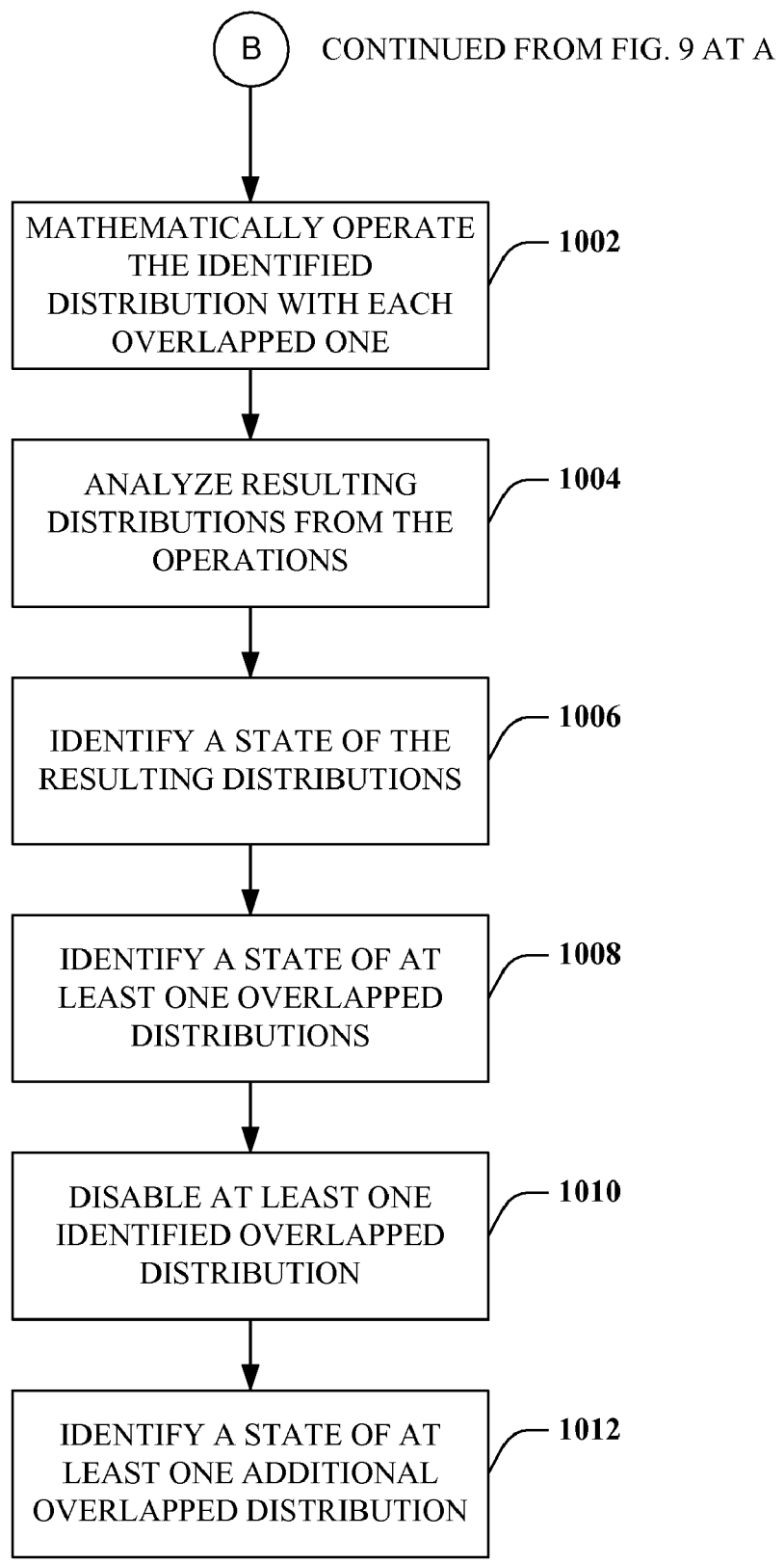

FIGS. 9 and 10 depict a flowchart of an exemplary methodology for utilizing logical relationships between state distributions to distinguish between overlapping distributions of dual cell memory devices in accord with aspects disclosed herein. At 902, state distributions of a plurality of multi cell memory devices are measured. At 904, one or more of the state distributions are shifted to create a non-overlapped distribution, as disclosed herein. At 906, a state associated with the non-overlapped distribution is identified. Such identification can be by way of conventional techniques and/or via methods described in the subject disclosure. At 908, identify an overlapped distribution related to the non-overlapped distribution by a logical relationship. Such logical relationship can include, for example, a relationship of proportionality or inverse proportionality as described in the subject specification. At 910, a determination is made as to whether such a distribution exists. If no distribution exists, methodology 900 proceeds to 912 where overlapping states can be identified utilizing traditional methods. If such a distribution is determined to exist at reference number 910, the methodology 900 proceeds to 914 where a second overlapped distribution is identified.

Methodology 900 then proceeds to 1002 at FIG. 10. Specifically, at 1002 the identified non-overlapping distribution is mathematically operated (e.g., adding, subtracting, or the like) with each overlapped distribution. At 1004, analyze two resulting distributions from the mathematical operations. At least one of the resulting distributions can be relatively less disperse than state distributions measured at 902 as a result of the logical relationship identified at 908. At 1006, a state of the resulting distributions is identified. Such identification can be facilitated by identifying a reference that bisects the resulting distributions, as defined herein. At 1008, a state of at least one of the overlapped distributions is identified, for instance, utilizing the state of the resulting distributions. At 1010, at last one identified overlapped distribution is disabled. At 1012, a state of at least one additional overlapped distribution can be identified, for instance, as a result of disabling a distribution that had overlapped it (e.g., the 3/1 state distribution (416) overlapping the 2/1 state distribution (414) indicated and described in detail at FIG. 4 supra).

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs. Additionally, some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 11:
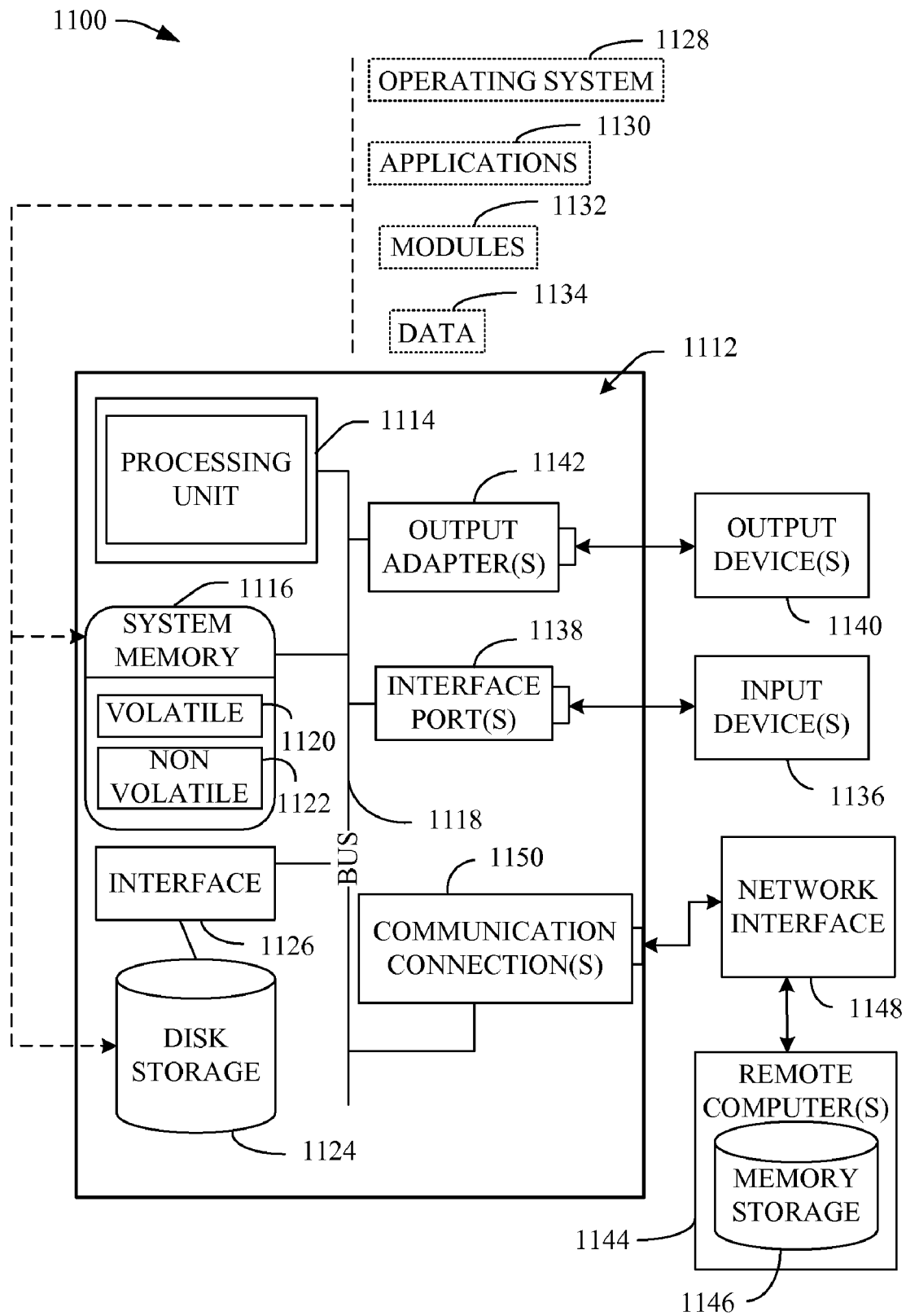
FIG. 11 is a block diagram of a suitable operating environment that can interface with a quad-bit memory device.
Figure 12:
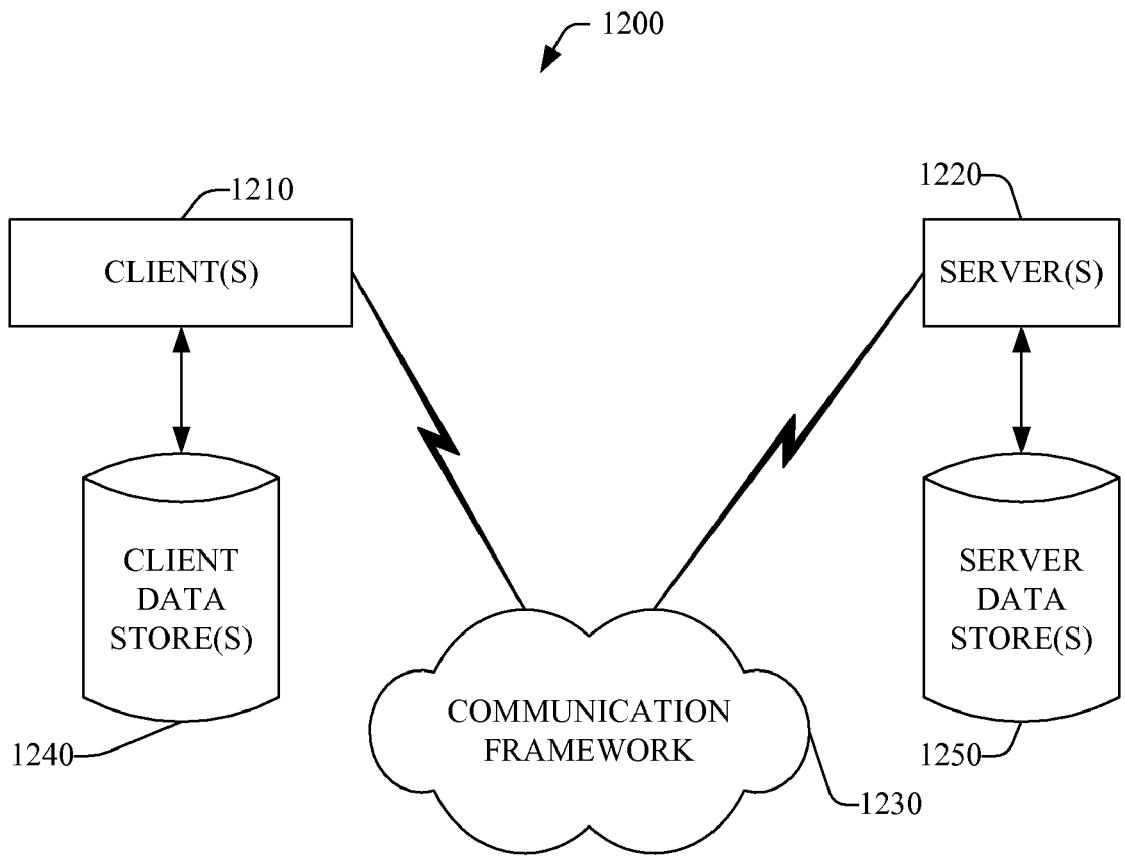
FIG. 12 is a schematic block diagram of a sample networking environment usable in conjunction with a quad-bit memory device.

In order to provide a context for the various aspects of the disclosed subject matter, FIGS. 11 and 12, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone computers. In a distributed computing environment, program modules may be located in both local and remote memory storage devices.

With reference to FIG. 11, a suitable environment 1100 for implementing various aspects of the claimed subject matter can include a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include ROM, PROM, electrically programmable ROM (EPROM), electrically erasable programmable ROM (EEPROM), or flash memory. Volatile memory 1120 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1112 also includes removable/non-removable, volatile/non-volatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in the suitable operating environment 1100. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the disclosed subject matter can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112 and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 with which the subject innovation can interact. The system 1200 includes one or more client(s) 1210. The client(s) 1210 can be hardware and/or software (e.g., threads, processes, computing devices). The system 1200 also includes one or more server(s) 1220. Thus, system 1200 can correspond to a two-tier client server model or a multi-tier model (e.g., client, middle tier server, data server), amongst other models. The server(s) 1220 can also be hardware and/or software (e.g., threads, processes, computing devices). The servers 1220 can house threads to perform transformations by employing the subject innovation, for example. One possible communication between a client 1210 and a server 1220 may be in the form of a data packet transmitted between two or more computer processes.

The system 1200 includes a communication framework 1230 that can be employed to facilitate communications between the client(s) 1210 and the server(s) 1220. The client(s) 1210 are operatively connected to one or more client data store(s) 1240 that can be employed to store information local to the client(s) 1210. Similarly, the server(s) 1220 are operatively connected to one or more server data store(s) 1250 that can be employed to store information local to the servers 1220.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods. In addition, while a particular feature may have been disclosed with respect to only one of several implementations, such feature may be combined with one or more other features of the other implementations as may be desired and advantageous for any given or particular application.

What is claimed is:

1. A system that distinguishes between overlapping state distributions of a plurality of multi-cell memory devices, comprising:
    a calculation component that performs a mathematical operation on two or more state distributions of a plurality of multi-cell memory devices, and generates a resulting distribution; and
    an analysis component that employs the resulting distribution in connection with distinguishing between overlapping state distributions of the plurality of multi-cell memory devices.

2. The system of claim 1, the resulting distribution is a third state distribution, different from the two or more state distributions.

3. The system of claim 1, the mathematical operation adds or subtracts the two or more state distributions with each other.

4. The system of claim 1, each state distribution of the two or more state distributions corresponds to a group of memory cells that are adjacent to each of the other groups of memory cells and corresponding state distributions.

5. The system of claim 1, the two or more state distributions are related by at least one logical or mathematical relationship.

6. The system of claim 5, the logical or mathematical relationship specifies that adjacent cells will have program values with substantially equivalent relative positions on state distributions corresponding to each of the adjacent cells.

7. The system of claim 5, the logical relationship specifies that adjacent cells will have program values with substantially opposite relative positions on state distributions corresponding to each of the adjacent cells.

8. The system of claim 1, the resulting distribution has a dispersity that is smaller than dispersities associated with at least one of the two or more state distributions.

9. A system that distinguishes between overlapping state distributions of a plurality of multi-cell memory devices, comprising:
means for mathematically operating on two or more state distributions of a plurality of multi-cell memory devices to provide a resulting distribution; and
means for identifying a state associated with state distributions of at least one cell of the multi-cell memory device based on the resulting distribution.

10. The system of claim 9, comprising means for providing a reference value that can be used to uniquely identify a state of non overlapping state distributions associated with common cells of a plurality of multi-cell memory devices.

11. The system of claim 9, comprising means for measuring that can identify a value of a programmable electrical characteristic associated with each cell of each of the plurality of multi-cell memory devices.

12. The system of claim 11, the value relates to a state of each cell.

13. The system of claim 11, the programmable electrical characteristic includes a current or a voltage, or both, associated with each cell.

14. The system of claim 9, comprising means for adjusting state distribution values that can shift state distributions associated with a state of the plurality of multi-cell memory devices, by changing a default program value associated with the state to a new program value, and reprogramming cells in accord with the new program value.

15. The system of claim 14, the means for adjusting can specify what other distributions are overlapped, if any, by distributions associated with the at least one common cell state by shifting state distributions.

16. A method for distinguishing potentially overlapping state distributions of a plurality of multi-cell memory devices, comprising:
identifying a program state of a non-overlapped state distribution of a plurality of multi-cell memory devices;
adding or subtracting the non-overlapped state distribution and an overlapped state distribution to form a resulting distribution; and
identifying a program state of the overlapped state distribution or a related overlapped state distribution, or both, from the resulting distribution.

17. The method of claim 16, further comprising at least one of:
shifting a first set of state distributions corresponding to a first program state to facilitate the identifying the program state of the non-overlapped state distribution; or
programming a cell of the plurality of multi-cell memory devices in a manner that enforces a logical relationship between the cell and at least one adjacent cell.

18. The method of claim 16, the non-overlapped state distribution and the overlapped state distribution are related by a logical relationship.

19. The method of claim 18, the logical relationship specifies that program values of cells associated with the non-overlapped state distribution have either substantially equal or substantially opposite relative positions compared with program values of cells associated with the overlapped distribution.

20. The method of claim 16, further comprising measuring each cell of a plurality of multi-cell memory devices to determine program values of the cells corresponding to one of two or more possible program states and generating state distributions from the measured program values, each state distribution corresponds to program states of a common group of cells and groups of cells adjacent to such common group.

* * * * *